United States Patent [19]

Ringeisen et al.

[11] Patent Number: 5,629,625

[45] Date of Patent: May 13, 1997

[54] PROCESS FOR ADJUSTING AS TO FREQUENCY, PARTICULARLY MICROWAVE BRIDGES, AND DEVICE EMBODYING SUCH A PROCESS

[75] Inventors: Victor Ringeisen, Riedseltz; Laurent Martinache, Haguenau, both of France

[73] Assignee: Sadis Bruker Spectrospin, Societe Anonyme de Diffusion de l'Instrumentation Scientifique, Bruker Spectrospin (Societe Anonyme a Directive), Wissembourg, France

[21] Appl. No.: 545,100

[22] Filed: Oct. 19, 1995

[30] Foreign Application Priority Data

Oct. 19, 1994 [FR] France ................... 94 12652

[51] Int. Cl.[6] ........................................ G01R 33/20
[52] U.S. Cl. ........................................ 324/316
[58] Field of Search ........................ 324/316, 317, 324/318, 300; 333/219, 219.2, 214.1; 335/296

[56] References Cited

U.S. PATENT DOCUMENTS

| | | | |
|---|---|---|---|
| 3,879,653 | 4/1975 | Hyde et al. | 324/316 |
| 4,803,624 | 2/1989 | Pilbrow et al. | 324/316 |
| 4,888,554 | 12/1989 | Hyde et al. | 324/316 |
| 5,302,898 | 4/1994 | Petnig et al. | 324/316 |
| 5,389,878 | 2/1995 | Nakagawa et al. | 324/316 |
| 5,397,988 | 3/1995 | Schmalbein et al. | 324/316 |

FOREIGN PATENT DOCUMENTS

| | | |
|---|---|---|
| 0570592 | 6/1993 | European Pat. Off. . |
| 4125592 | 2/1993 | Germany . |

OTHER PUBLICATIONS by Michael J. Pechan et al., "Automatic frequency control for solid–state sources in electron spin resonance", *Review of Scientific Instruments*, vol. 63, No. 7, Jul. 1, 1992, New York, pp. 3666–3669.

by Yasuyuki Morita et al., "EPR of Submicroliter Aqueous Samples Using a Microcoil", *Journal of Magnetic Resonance*, vol. 102A, No. 3, May 1, 1993, Orlando, MN, pp. 344–347.

by P. Lesniewski et al., "Phase noise reduction of a 19 GHz veractor–tuned Gunn oscillator for electron paramagnetic resonance spectroscopy", *Review of Scientific Instruments*, vol. 61, No. 8, Aug. 1, 1990, pp. 2248–2250.

by R. W. Quine et al., "Saturation recovery electron paramagnetic resonance spectrometer", *Review of Scientific Instruments*, vol. 63, No. 10, Oct. 1, 1992, New York, pp. 4251–4262.

*Primary Examiner*—Sandra L. O'Shea
*Assistant Examiner*—Raymond Y. Mah
*Attorney, Agent, or Firm*—Young & Thompson

[57] ABSTRACT

A process for frequency tuning microwave bridges and a device for practicing such a process. The process is characterized in that it consists in subjecting a resonator (3) to the radiation delivered by a secondary microwave source (10) sweeping a wide band of frequencies comprising particularly the frequency (F) of radiation delivered by the principal microwave source (1). The radiation reflected by the resonator (3) is displayed and the relative positions are marked along the frequency spectrum, of the frequency (F) and of the frequency of resonance (Fr) of the resonator (3). The frequency (F) of radiation delivered by the principal microwave source (1) is varied while controlling in real time the effect of this variation on the relative positions of the frequencies (F and Fr).

13 Claims, 2 Drawing Sheets

PROCESS FOR ADJUSTING AS TO FREQUENCY, PARTICULARLY MICROWAVE BRIDGES, AND DEVICE EMBODYING SUCH A PROCESS

BACKGROUND OF THE INVENTION

The present invention relates generally to tuning methods between emitter and receiver(s), particularly in the field of spectroscopy by electronic paramagnetic resonance (EPR), and more particularly the techniques and means for tuning apparatus before measurements of the characteristics of samples, and has for its object a process for tuning and adjusting as to frequency an assembly of the emitter/receiver type, particularly with microwave bridges by electronic paramagnetic resonance spectroscopy, and a device embodying such a process.

EPR spectroscopy consists in simultaneously subjecting a sample to be studied and characterized, to static (or permanent) magnetic fields created by an electromagnet and microwave radiation existing in a measuring resonator and analyzing the microwave radiation reflected by said measuring resonator under certain so-called resonance conditions of said sample.

The apparatus for the generation and the application of such microwave radiation to a sample and for the detection and analysis of the radiation reflected by said resonator is generally called a microwave bridge.

This latter is comprised essentially, on the one hand, of a microwave source whose radiation can be coupled to a measuring resonator, disposed in a permanent magnetic field (air gap of a magnet) in which can be mounted a sample to be analyzed, and, on the other hand, of devices for attenuating and dephasing said radiation and, finally, means for detection of the reflected radiation and for analysis and/or display of this latter.

Moreover, said microwave bridge also comprises a module, called a circulator, for applying the incident radiation to the resonator or to the sample/resonator assembly and for collecting the radiation reflected by these latter to send it to said detection means.

To use such a spectrometer, at the time of placing the sample in the resonator, it is particularly necessary to adjust or to tune the microwave source of the microwave bridge in question to the resonance frequency of the resonator, at which this latter totally absorbs the incident radiation (this resonance phenomenon is also called "dip").

To localize this absorption frequency, which varies according to the type of resonator and the sample, and to effect this adjustment, it is necessary to be able to rapidly sweep a range of frequencies of at least several tens of MHz by means of the microwave source.

When the microwave source is of a type adapted to be electronically tuned over a sufficient frequency range, for example of the type known by the term "klystron reflex", this sweeping and adjustment operation can be effected without particular difficulty.

However, it is not possible to proceed in this manner for microwave sources whose frequency tuning control sweeps only a narrow range.

Moreover, certain of these narrow range sources are highly reliable and exhibit a high degree of spectral purity, such as, particularly, the Gunn diode oscillators, giving rise to their use more and more frequently in microwave bridges.

To overcome this drawback, due to the use of narrow band microwave sources, there has been proposed a device based on the modulation of a radio frequency oscillator (see particularly DE-A 4125592).

Although it is possible to tune a microwave bridge by means of this known device, the sweeping width obtained is not very great and it is not possible, during adjustment or tuning of the frequency of the microwave source, to know, at the outset, whether the adjustment must be effected toward increasing or decreasing frequency values.

This latter drawback renders the tuning operation very delicate and sensitive in the case of certain spectroscopic experiments.

OBJECTS OF THE INVENTION

The present invention has for its object to overcome the above-cited drawbacks and to permit a rapid tuning, directed and controlled as to frequency, by carrying out a sweeping of a very much greater width than those which can be achieved by the above-cited known devices, whilst using a structure that is simple and easy to handle.

To this end, the present invention has for its object a process of tuning and adjusting as to frequency, assemblies of the emitter/receiver type, particularly of microwave bridges comprising essentially a microwave source whose radiation can be coupled to a resonator disposed in a permanent magnetic field and adapted to receive a sample, characterized in that it consists in subjecting the resonator to the radiation delivered by a secondary microwave source sweeping a wide band of frequencies comprising particularly the frequency of radiation delivered by the principal microwave source, said radiation from the secondary microwave source being, if desired, mixed, before application to the resonator, with the radiation, greatly attenuated, from the principal microwave source, in detecting the radiation reflected by said resonator and, if desired, the mentioned composite radiation, in determining in the relative positions, in the frequency spectrum, on the one hand, of the frequency of the principal source, in the form of a marker or a discontinuity and, on the other hand, of the resonance frequency or frequencies of said resonator, in the form of an absorption peak of resonance frequency, in causing to vary the radiation frequency delivered by the principal microwave source by controlling, in real time, the effect of this variation on the relative positions of the above-cited frequencies and, finally, in subjecting, for the purpose of measuring, at least one sample/resonator assembly, to the delivered radiation, in a non-attenuated manner, by the principal microwave source, this after the tuning of the frequency on the or with respect to the resonance frequency or frequencies of said resonator.

It also has for its object a device for the frequency tuning of apparatus for the generation of microwave radiation and for the detection and analysis of the resulting absorbed or reflected radiation, using the process described above and comprising, on the one hand, a secondary microwave source having a wide band of radiation frequencies, and, on the other hand, means to substitute, during the tuning operation, for the radiation delivered by said principal microwave source of the microwave bridge, either the radiation generated by the secondary source, or a composite radiation formed by the mixing of the radiations emitted from the secondary and principal sources, this latter source being greatly attenuated, and, finally, means for detection, analysis and/or display of the radiation reflected by the resonator, and, as the case may be, of the radiation coupled to said resonator, permitting the determination of the relative positions of the frequency of the principal source and of the frequency of resonance of the resonator.

BRIEF DESCRIPTION OF THE DRAWINGS

The invention will be better understood from the following description, which relates to preferred embodiments, given by way of nonlimiting examples, and explained with reference to the accompanying schematic drawings, in which.

DESCRIPTION OF THE PREFERRED EMBODIMENT

Figure 1:
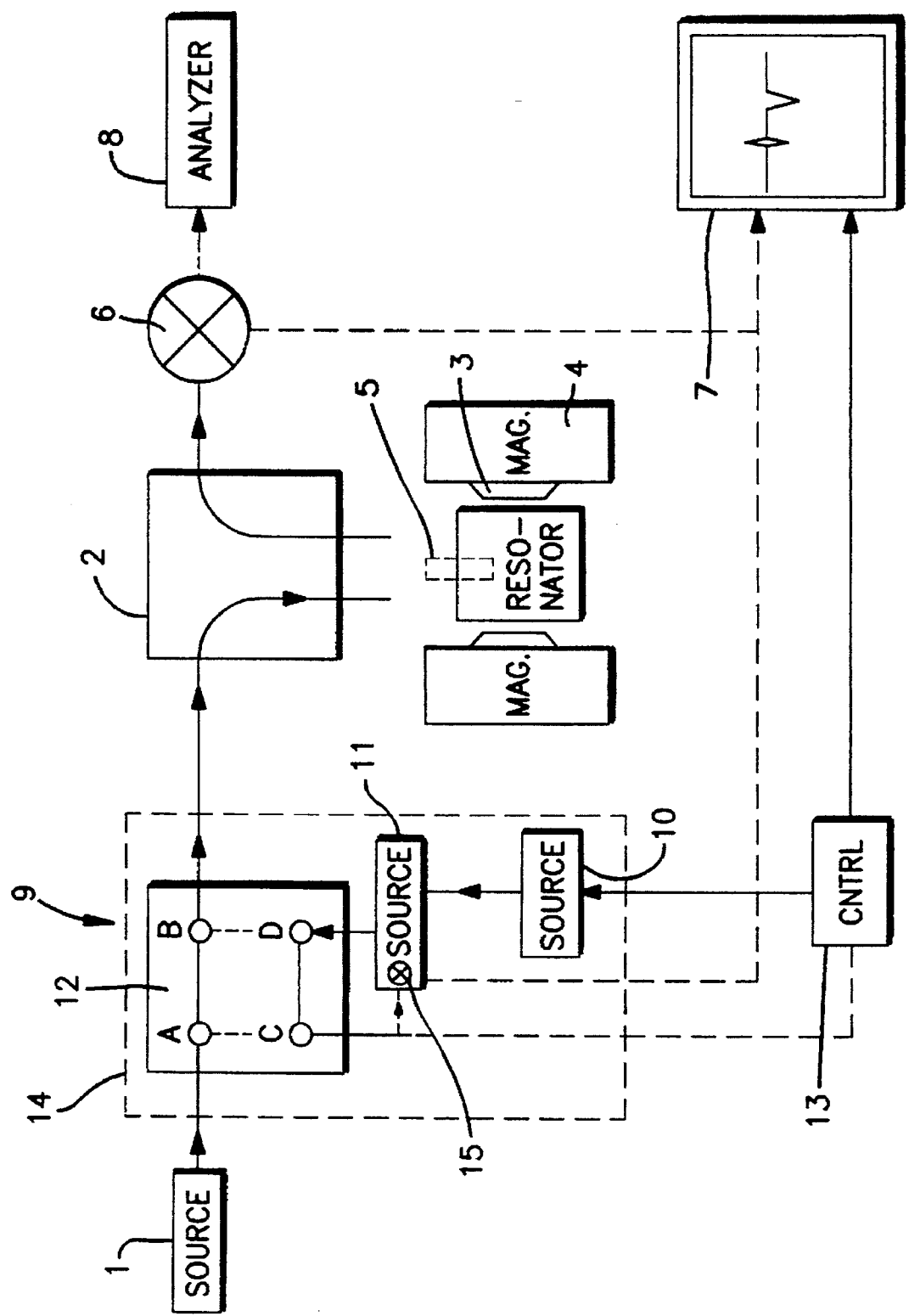
FIG. 1 shows schematically a microwave bridge equipped with a device according to the invention.

As shown in FIG. 1 of the accompanying drawings, a microwave bridge is, in a general manner, principally constituted by a powerful microwave source 1, of high spectral quality and with a narrow frequency tuning band, which will be desinated the principal microwave source in this text, by a module 2, called a circulator, which transmits the microwave radiation to a resonator 3 disposed in the air gap of a magnet 4 and in which can be mounted a sample 5 to be analyzed, by detection means 6 receiving the reflected radiation transmitted by the circulator 2 and by a display means 7 and analysis means 8 of the incident and/or reflected radiation, which can be used separately or simultaneously.

According to the invention, the process for tuning and adjusting the frequency consists, particularly for a microwave bridge as described above, in subjecting the resonator 3 to the radiation delivered by a secondary microwave source 10 sweeping a wide band of frequencies comprising particularly the frequency F of radiation delivered by the principal microwave source 1, said radiation from the secondary microwave source 10 being, if desired, mixed, before the application to the resonator 3, with greatly attenuated radiation from the principal microwave source 1, in detecting the radiation reflected by said resonator 3 and, if desired, the composite radiation mentioned above, in marking the relative positions, along the frequency spectrum, of the frequency F in the form of a marker or a discontinuity B, and of the frequency or frequencies of resonance Fr of said resonator 3, in the form of an absorption peak or "dip" by resonance frequency, in causing to vary the frequency F of the radiation delivered by the principal microwave source 1 by controlling, in real time, the effect of this variation on the relative positions of the frequencies F and Fr mentioned above and, finally, in subjecting, for the purpose of measuring, at least one sample 5/resonator 3 assembly to the radiation delivered, in an unattenuated manner, by the principal microwave source 1, this after tuning of the frequency F on or relative to the resonance frequency or frequencies Fr of said resonator 3.

According to a first characteristic of the invention, the secondary source 10 is also slaved as to frequency to the principal source 1 during the tuning phase in such a way that the frequency F of said principal source 1 will always be located in the middle of the frequency band swept by the secondary source 10.

Preferably, and so as to facilitate the operation of adjusting the frequencies F and Fr, the process can consist in slaving the display means 7, to the reflected and/or incident radiation at the level of the resonator or resonators 3, to the principal source 1, such that the frequency F of the radiation from the principal source 1 will always occupy a particular predetermined position, preferably the central position, in the displayed frequency spectrum.

Thus, the tuning of the frequency F of the principal source 1 is merely a simple visual regulation of the positions of the "dip" of the resonators 3 or simple centering of the "dip" or absorption peak of the resonator 3 from the screen of the display means 7, displaying the signal representing the power or amplitude of the radiation reflected by said resonator 3 as a function of the frequency, determined by the incident radiation.

The process according to the invention can also be used to make the frequency F of the principal source 1 coincide with the frequencies Fr of a resonator 3, hence to adjust the coupling of the resonance modes of the resonator 3 such that they will be substantially identical for the different resonances.

The relative positions of the frequencies F and Fr can be influenced and modified by acting either on the principal source 1, or on the resonator(s) 3 (which can be relatively difficult to carry out), or also on both.

Figure 2:
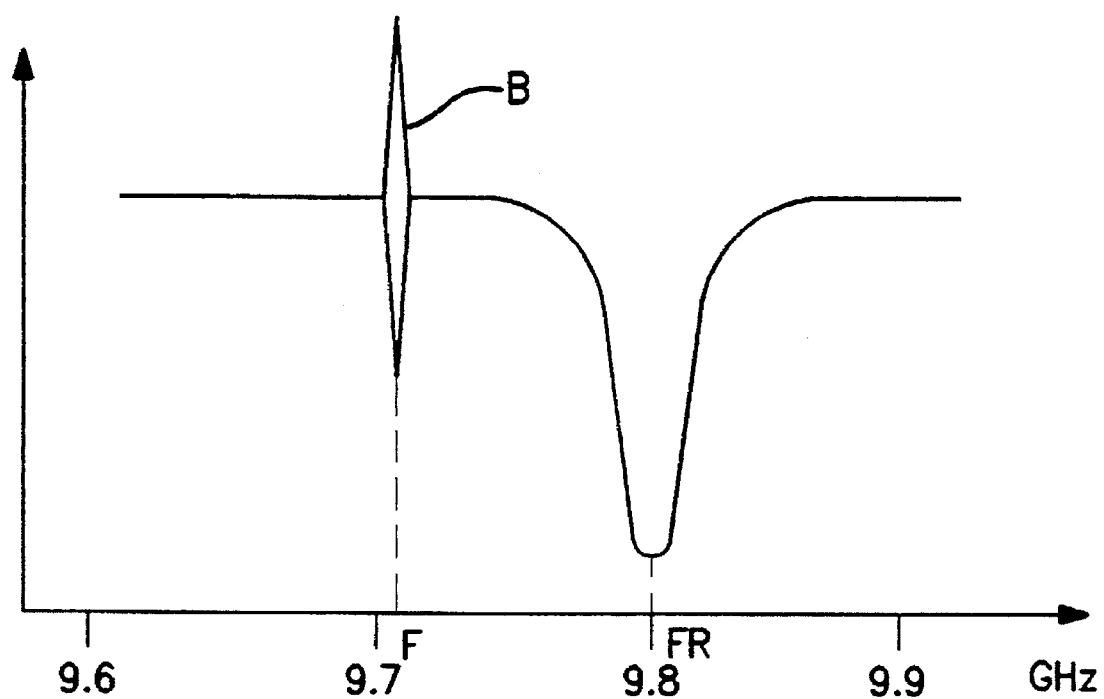
FIG. 2 shows, by way of example, a signal showing the reflected radiation at the beginning of the regulation and adjustment process, according to a modified embodiment of the invention.

As shown in FIGS. 1 and 2 of the accompanying drawings, and according to one characteristic of the invention which can be carried out as a modification or in addition to the mentioned arrangements, it can be provided to apply to the resonator 3 a composite incident radiation constituted by the superposition, on the one hand, of the delivered radiation, being substantially attenuated, by the principal microwave source 1 of the microwave bridge and, on the other hand, of the radiation delivered by the secondary microwave source 10, and in determining, for purposes of tuning, in the displayed reflected and/or incident radiation (s), a discontinuity B forming a marker and characterizing the frequency F of the principal microwave source 1 on the display means 7, said discontinuity B resulting from a mixing phenomenon due to the combination of the radiations from the principal microwave sources 1 and secondary microwave sources 10, when the frequencies of these two sources are quite close, and which can be picked up on the detection means 6 of the reflected radiation or on the mixing means 15 of the incident radiation.

In this latter case, the signal corresponding to the composite incident radiation is superposed on the signal corresponding to the reflected radiation, on the display means 7, with concordance of the frequency spectra.

Thus, the radiation from the principal microwave source 1, greatly attenuated and whose frequency is fixed, is therefore mixed with the unattenuated radiation delivered by the secondary microwave source 10, controlled so as to deliver a radiation whose variable frequency periodically sweeps over all or at least a portion of the range of frequencies possible for this source 10 and comprising particularly the frequencies F and Fr, the display means 7 of the reflected radiation and, as the case may be, incident radiation, operating in accordance with said periodic sweeping.

FIG. 2 shows by way of example a signal representing the power P of the radiation reflected by a resonator 3 having a resonance frequency Fr of 9.8 GHz and subjected to the composite radiation resulting from the superposition or the mixing, on the one hand, of a radiation of frequency F=9.7 GHz supplied, in attenuated form, by the principal microwave source 1 and, on the other hand, of a variable frequency radiation supplied by an oscillator controlled so as to effect a continuous sweeping of the frequency between 9.6 and 9.9 GHz.

The resonance frequency Fr of the resonator 3 is visualized by a negative peak (directed downwardly), showing the absorption of the incident radiation by the resonator 3 for this frequency, and the frequency F of the principal microwave source 1 is shown by a marker or impulse B, provoked by the mixing phenomenon and detected on the detection means 6 (modulation diode operating as a mixer) of the radiation reflected after the application of the composite radiation mentioned above or on the mixing means 15 (diode), when the superposed radiations constituting this composite radiation have very close frequencies.

It then suffices to cause the frequency F of the principal microwave source 1 to vary so as to cause this impulse B to coincide with the peak or the negative hollow ("dip"), so that said frequency F will be adjusted to the resonance frequency Fr of the resonator 3.

The secondary source 10, as well as a coupler circuit 11, comprising as the case may be a mixing means 15, could be grouped in a specific housing and could be removably mounted on a microwave bridge during the tuning phase.

It could also be provided, by means of a selection module 12 connected by one of its inputs to the output of the principal microwave source 1, to cause the microwave bridge to pass, in a reversible manner, from a first configuration adapted for tuning, in which the radiation delivered by the principal microwave source 1 is used to control the display means 7 and/or the secondary microwave source 10 and is, if desired, brought to a coupler circuit 11 to be superposed, after a great attenuation, to the radiation generated from the secondary microwave source 10, the radiation of said secondary source 10 or, as the case may be, the resulting composite radiation mentioned above being coupled to the resonator 3 and the radiation reflected by this latter being displayed, and a second configuration, adapted to the measurement and analysis of the characteristics of a sample 5, in which the radiation delivered by the principal microwave source 1 and having a frequency F identical to the resonance frequency Fr of the resonator 3, is applied, alone and without attenuation, to the assembly of the sample 5/resonator 3, the reflected radiation being analyzed so as to determine different characteristics of the sample 5.

Such an arrangement permits rapid passage from the measuring mode to the tuning mode, and conversely, which represents a large gain of time in the case of repeated tuning (changes of resonator, specimens, etc) in the course of successive experiments.

The invention also has for its object, as shown in FIG. 1 of the accompanying drawings, a device for the frequency tuning of microwave bridges, using the process described above and comprising, on the one hand, a secondary microwave source 10 having a wide radiation frequency band, and, on the other hand, means 11, 12 to substitute, during the tuning operation, for the radiation delivered by said principal microwave source 1 of the microwave bridge, either the radiation generated by the secondary source 10, or a composite radiation formed by the mixing of the radiations from the secondary microwave source 10 and the principal microwave source 1, the principal source 1 being substantially attenuated, and, finally, means 6, 7, 15 for the detection, analysis and/or display of the radiation reflected by the resonator 3 and, as the case may be, of the radiation coupled to said resonator 3, permitting marking the relative positions of the frequency F of the principal source 1 and of the resonance frequency (at least one) of the resonator 3.

According to a characteristic of the invention, the secondary source 10 could preferably be slaved, as to frequency, to the principal source 1 during the tuning phase such that the frequency F of said principal source 1 will always be located in the middle of the frequency band swept by the secondary source 10, the display means used as the case may be could also be controlled by the principal source 1.

The secondary microwave source 10 could consist of a wide band oscillator, associated with control means 13 allowing to periodically sweep all or a portion of the radiation frequency range able to be delivered by said oscillator, said control means 13 being also adapted to control the display means 7 permitting to visually mark the relative positions along the frequency spectrum, of the frequency F of the principal microwave source 1 and of the resonance frequency Fr of the resonator 3 which are at least present.

The secondary microwave source 10, which is used only during the tuning phase of the microwave bridge, need not have the same performance as to spectral purity, stability and power as the principal microwave source 1 for measuring and analysis, and could therefore be of lesser quality and of lower price.

The control means 13 could consist of a ramp generator permitting, as a result, to obtaining uniform and cyclic frequency sweeping by the secondary microwave source 10.

According to an embodiment of the invention, shown in FIG. 1 of the accompanying drawings, the substitution means are essentially constituted by a coupling circuit 11 which applies the composite radiation or the radiation from the secondary source 10 to the resonator 3 and comprising, as the case may be, a mixing means 15 permitting mixing said composite radiation and, if desired, by a selection module 12 of the radiation applied to the resonator 3 or to the sample 5/resonator 3 assembly.

For the case in which a selection module 12 is provided, this latter can preferably be present in the form of a transfer relay, which is switchable, in a reversible manner, from a first condition, adapted for the tuning of the microwave bridge and in which the resonator 3 is subjected to a radiation constituted by the radiation of the secondary source 10 or by the superposition of the radiations delivered by the principal microwave source 1 and secondary microwave source 10, to a second condition, adapted to the measurement of the characteristics of the sample 5 and in which the sample 5/resonator 3 assembly is subjected to the delivered radiation, in an unattenuated manner, by the principal microwave source 1, the coupler 11 and the secondary microwave source 10 being then isolated from the microwave bridge.

FIG. 1 shows schematically the configurations of the transfer relay 12 in tuning mode (broken lines between the terminals A and C/B and D) and in the measurement/analysis mode (full lines between the terminals A and B/C and D).

As already mentioned above, the tuning device according to the invention could be used in a particularly advantageous manner when the principal microwave source 1 is narrow band, particularly when it assumes the form of a Gunn diode oscillator mounted in a resonant cavity.

Said tuning device is preferably such that the secondary microwave source 10 and the substitution means 11, 12 (when they are present) are mounted in an independent housing 14, being adapted to be mounted in series in a microwave bridge, between the microwave source 1 of this latter and the circulator module 2.

Thanks to the invention, it is therefore possible, in the tuning mode, to generate and display a frequency band of great width, which is limited only by the maximum abilities of the existing tunable oscillators, whilst preserving the advantages of a narrow band principal microwave source, for measurement, the passage from one mode to the other being effected by simple single switching.

Moreover, the embodying device is of simple structure and low cost, easy to use and to install in existing microwave bridges and of small size.

Of course, the invention is not limited to the embodiment described and shown in the accompanying drawings. Modifications remain possible, particularly as to the construction of various elements, or by substitution of technical equivalents, without thereby departing from the scope of protection of the invention.

We claim:

1. Process for tuning and adjusting, as to frequency, emitter/receiver assemblies comprising microwave bridges allowing microwave radiation to be coupled to a resonator disposed in a static magnetic field and adapted to receive a sample, the process comprising: subjecting a resonator (3) to radiation from a secondary independent microwave source (10) sweeping a band of frequencies, said band of frequencies including a frequency (F) of a radiation delivered by a principal microwave source (1), said radiation from the secondary microwave source (10) being mixed, before application to the resonator (3), with strongly attenuated radiation from the principal microwave source (1); detecting radiation reflected by said resonator (3) and said mixed radiation; marking relative positions in the frequency spectrum of the frequency (F) and of a resonance frequency (Fr) of said resonator (3); varying the frequency (F) of radiation delivered by the principal microwave source (1) by controlling, in real time, the effect of this variation on the relative positions of said frequencies (F and Fr); and subjecting at least one sample (5), and a resonator (3) assembly to the radiation delivered, in an unattenuated manner, from the principal microwave source (1) after tuning of the frequency (5) relative to the resonance frequency (Fr) of said resonator (3).

2. Process according to claim 1, wherein said secondary source (10) is slaved as to frequency, to the principal source (1) during a tuning phase such that the frequency (F) of said principal source (1) will always be in the middle of the frequency band swept by the secondary source (10).

3. Process according to claim 1, further comprising controlling display means (7) of the reflected or incident radiation on the resonator (3), by the principal source (1), such that the frequency (F) of radiation of the principal source (1) always occupies a central position of the displayed frequency spectrum.

4. Process according to claim 1, further comprising applying to the resonator (3) a composite incident radiation constituted by the superposition of the delivered radiation which is substantially attenuated by the principal microwave source (1) of the microwave bridge and, of the radiation delivered by the secondary microwave source (10); and marking, for tuning purposes in the reflected or incident radiations displayed, a discontinuity (B) forming a marker and characterizing the frequency (F) of the principal microwave source (1) on the display means (7), said discontinuity (B) resulting from mixing of the combination of radiations from the principal microwave source (1) and the secondary microwave source (10) when the frequencies of these two sources are close to each other and adapted to be picked up by detection means (6) of the reflected radiation or by incident radiation mixing means (15).

5. Process according to claim 1, further comprising controlling the secondary microwave source (10) so as to deliver a radiation whose variable frequency periodically sweeps over at least a portion of the range of possible radiation frequencies that can be delivered by said secondary source (10), the display means (7) of the reflected and incident radiation operating in accordance with said periodic sweeping.

6. Process according to claim 1, which further comprises, by means of a selection module (12) connected by an input to the output of the principal microwave source (1), causing the microwave bridge to pass in reversible manner from a first configuration adapted for tuning, in which the radiation delivered by the principal microwave source (1) is used to control at least one of the display means (7) and the secondary microwave source (10) and is delivered to a coupler circuit (11) to be superposed, after substantial attenuation, on the radiation from the secondary microwave source (10), the radiation of said secondary source (10) or the resulting composite radiation being coupled to the resonator (3) and the radiation reflected by this latter being displayed, to a second configuration adapted for the measurement and analysis of the characteristics of a sample (5), in which the radiation delivered by the principal microwave source (1) and having a frequency (F) identical to the resonance frequency (Fr) of the resonator (3) is applied alone and without attenuation to an assembly of a sample (5) and a resonator (3), the reflected radiation being analyzed so as to determine different characteristics the sample (5).

7. Device for frequency tuning an apparatus for the generation of microwave radiation and for detection and analysis of the resulting absorbed or reflected radiation, comprising a microwave bridge, an independent secondary microwave source (10) having a band of radiation frequencies, means (11, 12) to substitute, during a tuning operation, for the radiation delivered by a principal microwave source (1) of the microwave bridge, either the radiation generated by the secondary source (10), or a composite radiation formed by a mixing of radiations from the secondary microwave source (10) and the principal microwave source (1), said radiation from said principal microwave source (1) being substantially attenuated, and means (6, 7, 15) for the detection and analysis and display of the radiation reflected by the resonator (3) and of the radiation coupled to said resonator (3), so as to permit determining in relative positions of the frequency (F) of the principal source (1) and of the resonance frequency of the resonator (3), said band of radiation frequencies of said secondary microwave source including said frequency (F) of said principal source (1).

8. Device according to claim 7, wherein the secondary source (10) is slaved to the frequency of the principal source (1) during a tuning phase such that the frequency (F) of said principal source (1) will always be located at the middle of the frequency band swept by the secondary source (10), display means (7) being provided and slaved to said principal source (1).

9. Device according to claim 7, wherein the secondary microwave source (10) consists of a wide band oscillator associated with control means (13) permitting to periodically carry out a sweeping of at least a portion of the range of frequencies of radiation able to be delivered by said oscillator, said control means (13) being adapted also to control the display means (7) permitting visually determining in the relative positions in the frequency spectrum, of the frequency (F) of the principal microwave source (1) and of the resonance frequency (Fr) of the resonator (3).

10. Device according to claim 7, wherein said means to substitute are comprised by a coupler circuit (11) adapted to apply to the resonator (3) the composite radiation or radiation from the secondary source (10) and comprising mixing means (15) permitting mixing said composite radiation by a selection module (12) of the radiation applied to the resonator (3) or to the assembly of a sample (5) and a resonator (3).

11. Device according to claim 10, wherein the selection module (12) is in the form of a transfer relay which is reversibly switchable from a first state adapted for the tuning of the microwave bridge and in which the resonator (3) is subjected to radiation constituted by the radiation of the secondary source (10) or by the superposition of the radiations delivered by the principal microwave source (1) and the secondary microwave source (10), in a second condition adapted to the measurement of the characteristics of the sample (5) and in which the sample (5) and resonator (3) assembly is subjected to the radiation delivered in an unattenuated manner by the principal microwave source (1), the coupler circuit (11) and the secondary microwave source (10) being then isolated from the microwave bridge.

12. Device according to claim 7, wherein the principal microwave source (1) is in the form of a Gunn diode oscillator mounted in a resonant cavity.

13. Device according to claim 7, wherein the secondary microwave source (10) and the substitution means (11, 12) are mounted in an independent casing (14) which can be mounted in series in a microwave bridge.

* * * * *